United States Patent
Zhao et al.

(10) Patent No.: US 8,486,805 B2
(45) Date of Patent: Jul. 16, 2013

(54) THROUGH-SILICON VIA AND METHOD FOR FORMING THE SAME

(75) Inventors: Chao Zhao, Kessel-lo (BE); Dapeng Chen, Beijing (CN); Wen Ou, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 13 days.

(21) Appl. No.: 13/142,757

(22) PCT Filed: Apr. 11, 2011

(86) PCT No.: PCT/CN2011/072593
§ 371 (c)(1),
(2), (4) Date: Jun. 29, 2011

(87) PCT Pub. No.: WO2012/119333
PCT Pub. Date: Sep. 13, 2012

(65) Prior Publication Data
US 2012/0223431 A1  Sep. 6, 2012

(30) Foreign Application Priority Data
Mar. 4, 2011  (CN) .......................... 2011 1 0052134

(51) Int. Cl.
*H01L 21/30* (2006.01)
(52) U.S. Cl.
USPC ............ 438/459; 438/759; 438/959; 438/977
(58) Field of Classification Search
USPC ..... 438/459, 759, 959, 977, FOR. 100–FOR. 134, FOR. 385–FOR. 406, FOR. 485
See application file for complete search history.

(56) References Cited

U.S. PATENT DOCUMENTS

| | | | |
|---|---|---|---|
| 7,633,165 B2 | 12/2009 | Hsu et al. | |
| 7,683,459 B2 | 3/2010 | Ma et al. | |
| 7,871,927 B2 * | 1/2011 | Trezza | 438/667 |
| 7,989,318 B2 * | 8/2011 | Yang et al. | 438/459 |
| 8,049,310 B2 * | 11/2011 | Wolter et al. | 257/621 |

(Continued)

FOREIGN PATENT DOCUMENTS

| | | |
|---|---|---|
| CN | 1909208 A | 2/2007 |
| CN | 101553903 A | 10/2009 |

OTHER PUBLICATIONS

International Search Report and Written Opinion (in Chinese) for PCT/CN2011/072593, mailed Sep. 29, 2011; ISA/CN.

*Primary Examiner* — David E Graybill
(74) *Attorney, Agent, or Firm* — Harness, Dickey & Pierce, P.L.C.

(57) ABSTRACT

A through-silicon via and a method for forming the same are provided. The method includes: providing a semiconductor substrate, the semiconductor substrate including an upper surface and an opposite lower surface; etching the upper surface of the semiconductor substrate to form an opening; filling the opening with a conductive material to form a first nail; etching the lower surface of the semiconductor substrate to form a recess, such that the first nail is exposed at a bottom of the recess; filling the recess with a conductive material that can be etched, and etching the conductive material that can be etched to form a second nail, such that the second nail is vertically connected with the first nail; and filling a gap between the second nail and the semiconductor substrate and a gap between the second nail and an adjacent second nail with a dielectric layer. Then invention can improve the reliability of through-silicon vias and avoid voids.

12 Claims, 8 Drawing Sheets

U.S. PATENT DOCUMENTS

| | | |
|---|---|---|
| 8,390,083 B2 * | 3/2013 | O'Donnell et al. ............ 257/414 |
| 8,390,130 B1 * | 3/2013 | Hiner et al. .................... 257/774 |
| 2003/0222354 A1 | 12/2003 | Mastromatteo et al. |
| 2007/0032059 A1 * | 2/2007 | Hedler et al. .................. 438/597 |
| 2008/0090413 A1 * | 4/2008 | Trezza .......................... 438/667 |
| 2008/0203556 A1 | 8/2008 | Huang |
| 2009/0039527 A1 * | 2/2009 | Chan et al. .................... 257/777 |
| 2009/0212438 A1 * | 8/2009 | Kreupl et al. ................. 257/773 |
| 2010/0264548 A1 | 10/2010 | Sanders et al. |
| 2011/0057273 A1 * | 3/2011 | O'Donnell et al. ............ 257/414 |
| 2012/0223431 A1 * | 9/2012 | Zhao et al. .................... 257/770 |

\* cited by examiner

THROUGH-SILICON VIA AND METHOD FOR FORMING THE SAME

CROSS-REFERENCE TO RELATED APPLICATION

This application is a Section 371 national stage application of International Application No. PCT/CN2011/072593 filed Apr. 11, 2011, which claims priority to CN201110052134.4 filed on Mar. 4, 2011, the contents of which are incorporated herein by reference in their entirety.

FIELD OF THE INVENTION

The present invention relates to the field of semiconductor technology, and particularly to a through-silicon via and a method for forming the same.

BACKGROUND OF THE INVENTION

A 3D package contains two or more integrated circuits stacked vertically so that they occupy less space. Many 3D packages use an integrated circuit-carrying substrate with through-silicon vias (TSVs). By using TSV technology instead of conventional edge wiring, 3D packages can pack a great deal of functionality into a small footprint. In addition, critical paths through the device can be effectively shortened, leading to reduced delay and faster operation.

TSV technology generally includes forming a through-substrate via, filling it to obtain a nail and bonding the nail to an interconnection structure on another wafer/chip, to realize a 3D package. Specifically, the following schemes may be employed: via-first, in which the TSV is made before making of the circuits; via-middle, in which the TSV is made after front-end-of-line processing (making of the devices) and before back-end-of-line processing (making of the interconnection structures); via-last, in which the TSV is made after making of the circuits, i.e. after making of the devices and the interconnection structures; and via-after-bonding, in which the TSV is made after bonding between two wafers or a chip to a wafer.

Conventional methods for forming a TSV are based on copper metallization techniques. FIG. 1 to FIG. 5 illustrate a cross-sectional view of an intermediate structure according to a conventional method for forming a TSV.

Figure 1:
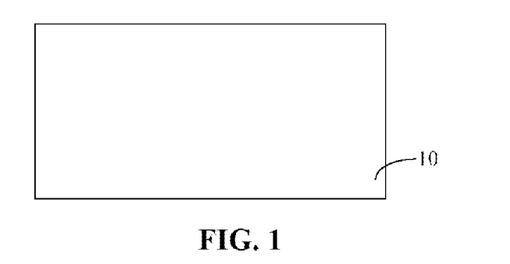
FIG. 1 to FIG. 5 illustrate a conventional method for forming a TSV with a cross-sectional view.

As shown in FIG. 1, a semiconductor substrate 10 is provided. The semiconductor substrate 10 may be provided with a semiconductor device (e.g., MOS transistor) or a semiconductor and an interconnection structure formed on it, or may be provided with no semiconductor devices or interconnection structures.

Figure 2:
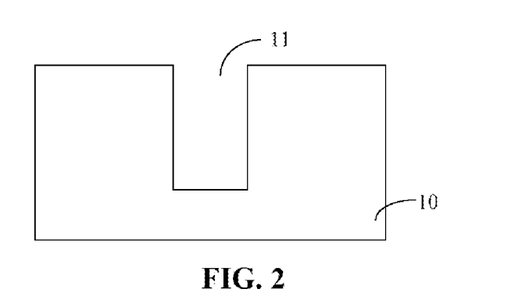

As shown in FIG. 2, the upper surface of the semiconductor substrate 10 is etched, to form an opening 11.

Figure 3:
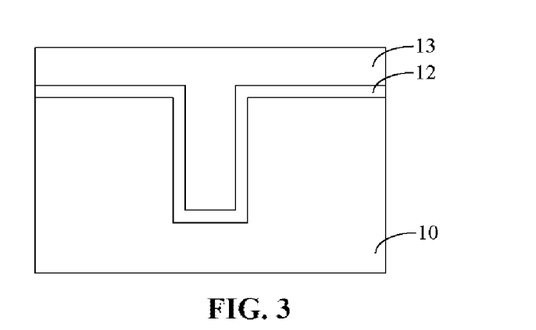

As shown in FIG. 3, a barrier layer 12 is formed over the bottom and sidewalls of the opening and the upper surface of the semiconductor substrate 10; then, metal copper 13 is formed on the barrier layer 12 by electroplating, which fills the opening. The method further includes forming a seed layer on the surface of the barrier layer 12 before forming the metal copper 13.

Figure 4:
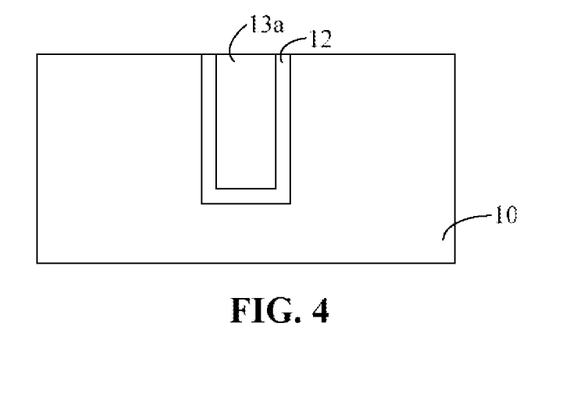

As shown in FIG. 4, the metal copper and the barrier layer 12 over the semiconductor substrate 10 are planarized such that the upper surface of the semiconductor substrate 10 is exposed, to form a nail 13a.

Figure 5:
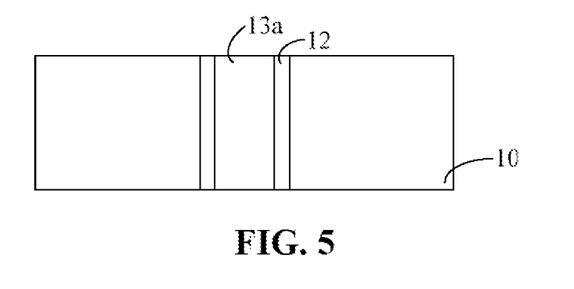

As shown in FIG. 5, the semiconductor substrate 10 is thinned from its lower surface such that the nail 13a is exposed and the opening becomes a via passing completely through the semiconductor substrate 10, thereby finishing forming of the TSV.

No matter which scheme (via-first, via-middle, via-last or via-after-bonding) is employed, forming of TSVs based on copper metallization faces a big challenge in copper filling. For example, in applications such as MEMS (Microelectromechanical system), where a sensor is connected to a control circuit, the sensor and the control circuit can be made on respective semiconductor substrates, and TSVs can be used to connect each of the subunits of the sensor to a corresponding subunit of the control circuit, thereby simplifying design and production procedures and improving yield.

However, such applications require a high density of the TSVs, i.e., more TSVs per unit area. To meet the density requirement, the diameter of a TSV has to be kept small; meanwhile, the thickness of the semiconductor substrate should be large enough to maintain its mechanical strength, resulting in an aggressive aspect ratio of the TSV. As the aspect ratio of the TSV increases, especially when it is over 10:1, it will be difficult to form continuous barrier and seed layers. And the discontinuity of the barrier and seed layers may induce voids in the nail formed through electroplating, and cause reliability issues or even circuit breakage.

For more information on TSV technology, please refer to U.S. Pat. Nos. 7,683,459 and 7,633,165.

SUMMARY OF THE INVENTION

The problem to be solved by the present invention is the reliability issues in the prior art of copper metallization-based TSVs with an increased aspect ratio.

To solve the problem above, the present invention provides a through-silicon via, including:

a semiconductor substrate, wherein the semiconductor substrate includes a recess formed on it, and the recess is filled with a dielectric layer; and a nail passing through the semiconductor substrate and the dielectric layer, wherein the nail includes a first nail and a second nail connected vertically, the first nail is embedded in the semiconductor substrate, the second nail is embedded in the dielectric layer, and the second nail is formed of a conductive material that can be etched.

Optionally, the conductive material that can be etched is any one of: aluminium, doped polycrystalline silicon, and doped polycrystalline silicon-germanium.

Optionally, the dielectric layer is formed of any one of: silicon oxide, silicon oxynitride, and a low-k dielectric.

Optionally, the first nail is formed of any one of: copper, tungsten, aluminium, and doped polycrystalline silicon.

The present invention also provides a method for forming a through-silicon via, including:

providing a semiconductor substrate, the semiconductor substrate including an upper surface and an opposite lower surface;

etching the upper surface of the semiconductor substrate to form an opening;

filling the opening with a conductive material to form a first nail;

etching the lower surface of the semiconductor substrate to form a recess, such that the first nail is exposed at a bottom of the recess;

filling the recess with a conductive material that can be etched, and etching the conductive material that can be etched to form a second nail, such that the second nail is vertically connected with the first nail; and filling a gap between the second nail and the semiconductor substrate and a gap between the second nail and an adjacent second nail with a dielectric layer.

Optionally, the conductive material that can be etched is any one of: aluminium, doped polycrystalline silicon, and doped polycrystalline silicon-germanium.

Optionally, the conductive material that can be etched is aluminium, and the filling the recess with a conductive material that can be etched is performed by physical vapor deposition (PVD) or chemical vapor deposition (CVD).

Optionally, the dielectric layer is formed of any one of: silicon oxide, silicon oxynitride, and a low-k dielectric.

Optionally, the method further includes: after forming of the first nail and before forming of the recess,
  attaching the upper surface of the semiconductor substrate to a carrier substrate; and
  thinning the lower surface of the semiconductor substrate.

Optionally, the method further includes: before the attaching the upper surface of the semiconductor substrate to a carrier substrate,
  forming a lithography alignment mark on the upper surface of the semiconductor substrate, the lithography alignment mark having a depth larger than a depth of the first nail.

Optionally, the thinning the lower surface of the semiconductor substrate is performed such that the lithography alignment mark is exposed.

Optionally, the carrier substrate is a silicon substrate or a glass substrate.

Optionally, the conductive material is copper, and the filling the opening with a conductive material to form a first nail includes:
  forming a barrier layer and a seed layer over a bottom and a sidewall of the opening;
  filling the opening with copper, which covers the seed layer;
  planarizing the surface of the copper, such that the upper surface of the semiconductor substrate is exposed.

Optionally, the conductive material is tungsten or aluminium, and the filling the opening with a conductive material is performed by physical vapor deposition (PVD) or chemical vapor deposition (CVD).

Optionally, the conductive material is doped polycrystalline silicon, and the filling the opening with a conductive material is performed by CVD.

Optionally, the method further includes: after forming of the dielectric layer,
  planarizing a surface of the dielectric layer, such that the second nail is exposed.

The embodiments of the present invention have the following advantages compared with the prior art.

In the method for forming a through-silicon via according to the embodiments of the present invention, firstly an opening with an appropriate aspect ratio is formed on the upper surface of the semiconductor substrate, and a first nail is formed by filling the opening. Generally, the aspect ratio of the opening is medium, resulting in better filling that forms the first nail, and avoiding voids in the first nail. Then, a recess is formed on the lower surface of the semiconductor substrate, and a second nail is formed by filling the recess with a conductive material that can be etched and etching the material. Generally, the recess is formed with a relatively large width, i.e., a relatively small aspect ratio, resulting in better filling-in of the conductive material that can be etched, and avoiding voids in the second nail formed through etching. Therefore, the through-silicon via formed according to the embodiments of the present invention can have a large aspect ratio while being highly reliable.

DETAILED DESCRIPTION OF THE INVENTION

Conventional methods for forming a TSV are based on copper metallization techniques. As the density of TSVs increases, the aspect ratio of the TSV increases, causing the copper diffusion barrier layer and the seed layer to not fully cover the inner surface of the via, inducing voids in the nail formed through electroplating, and causing reliability issues or even circuit breakage.

In the method for forming a TSV according to the embodiments of the present invention, firstly an opening with an appropriate aspect ratio is formed on the upper surface of the semiconductor substrate, and a first nail is formed by filling the opening. Generally, the aspect ratio of the opening is medium, resulting in better filling that forms the first nail, and avoiding voids in the first nail. Then, a recess is formed on the lower surface of the semiconductor substrate, and a second nail is formed by filling the recess with a conductive material that can be etched and etching the material. Generally, the recess is formed with a relatively large width, i.e., a relatively small aspect ratio, resulting in better filling-in of the conductive material that can be etched, and avoiding voids in the second nail formed through etching. Therefore, the TSV formed according to the embodiments of the present invention can have a large aspect ratio while being highly reliable.

For better understanding of the objective, features and advantages of the present invention, the embodiments of the invention will be described hereinafter in conjunction with the accompanying drawings.

Details of the embodiments of the invention are described below for descriptive purpose. It should be noted that the invention can be implemented other than the embodiments disclosed herein, and modifications can be made by those skilled in the art without deviation from the scope of the invention. Hence, the scope of the invention is not limited to the embodiments disclosed herein.

Figure 6:
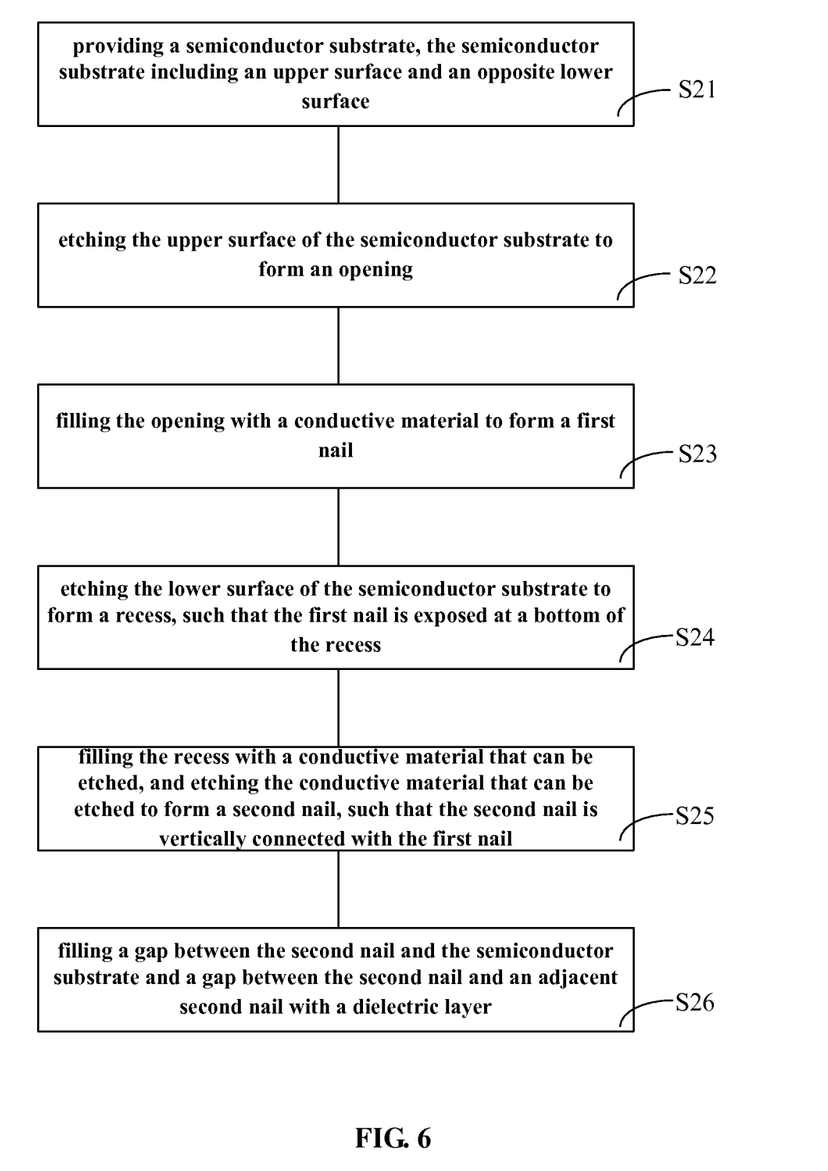
FIG. 6 is a flow chart of a method for forming a TSV according to an embodiment of the present invention.

FIG. 6 is a flow chart of a method for forming a TSV according to an embodiment of the present invention, including:
  step S21: providing a semiconductor substrate, the semiconductor substrate including an upper surface and an opposite lower surface;
  step S22: etching the upper surface of the semiconductor substrate to form an opening;
  step S23: filling the opening with a conductive material to form a first nail;
  step S24: etching the lower surface of the semiconductor substrate to form a recess, such that the first nail is exposed at a bottom of the recess;
  step S25: filling the recess with a conductive material that can be etched, and etching the conductive material that can be etched to form a second nail, such that the second nail is vertically connected with the first nail; and step S26: filling a gap between the second nail and the semiconductor substrate and a gap between the second nail and an adjacent second nail with a dielectric layer.

FIG. 7 to FIG. 19 illustrate a method for forming a TSV according to an embodiment of the present invention with a cross-sectional view. A first embodiment is described below with reference to FIG. 6 and FIG. 7 to FIG. 19.

Figure 7:
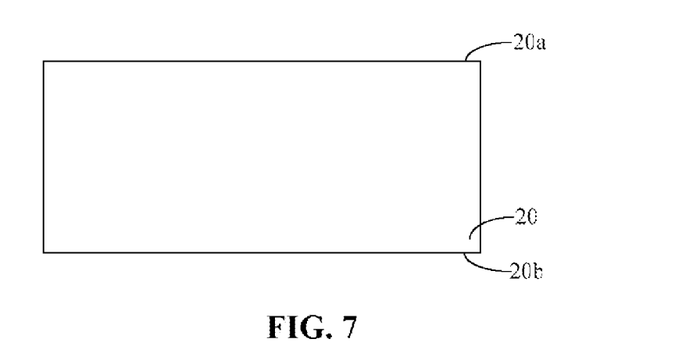
FIG. 7 to FIG. 19 illustrate a method for forming a TSV according to an embodiment of the present invention with a cross-sectional view.

With reference to FIG. 6 and FIG. 7, step S21 is performed: providing a semiconductor substrate 20, the semiconductor substrate 20 including an upper surface 20a and an opposite lower surface 20b. Specifically, the semiconductor substrate 20 may be a silicon substrate, a silicon-germanium substrate, a III-V substrate, a silicon carbide substrate or a multi-layer structure of it, a silicon-on-insulator structure, or other semiconductor substrates known in the art. In this embodiment, the semiconductor substrate 20 is a silicon substrate. The semiconductor substrate 20 may include a sensor or a control circuit, or may be a bare silicon substrate.

Figure 8:
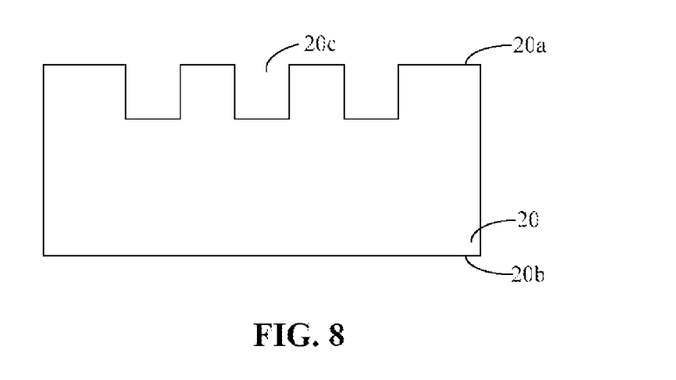

With reference to FIG. 6 and FIG. 8, step S22 is performed: etching the upper surface 20a of the semiconductor substrate to form an opening 20c. As an example, the number of openings 20c shown in FIG. 8 is 3. Specifically, forming of the opening 20c may include: forming a photoresist layer on the upper surface 20a of the semiconductor substrate 20, and patterning it to define the pattern of the opening 20c; etching the upper surface 20a by using the patterned photoresist layer as a mask, to form the opening 20c; and removing the patterned photoresist layer.

It should be noted that, the opening 20c does not pass through the semiconductor substrate 20. The width of the opening 20c equals to the desired width of the eventual nail in the TSV. The depth of the opening 20c depends on the material and process for the first nail formed subsequently. Hence, the aspect ratio of the opening 20c should ensure good filling that forms the first nail, which is based on conventional CVD and electroplating, and avoid voids in the first nail.

Figure 9:
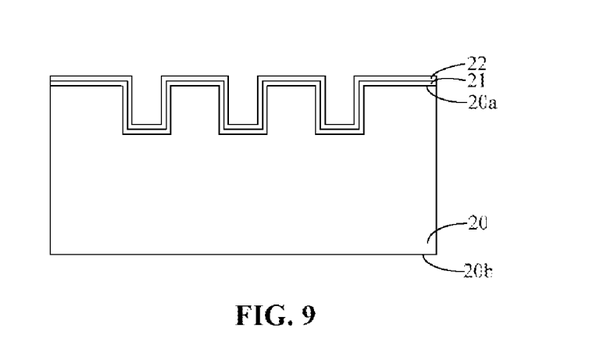
Figure 10:
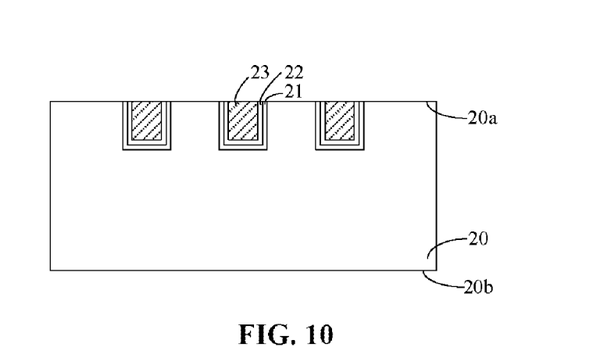

With reference to FIG. 6 and FIG. 10, step S23 is performed: filling the opening with a conductive material 23 to form a first nail. The conductive material 23 is any one of: copper, tungsten, aluminium, and doped polycrystalline silicon. In this embodiment, the conductive material 23 is copper, and the first nail includes a barrier layer 21 and a seed layer 22 formed over the sidewall and bottom of the opening. Forming of the first nail is described below with reference to FIG. 9 and FIG. 10.

Firstly, with reference to FIG. 9, a barrier layer 21 and a seed layer 22 are formed over a bottom and a sidewall of the opening. In this embodiment, the barrier layer 21 and the seed layer 22 also cover the upper surface 20a of the semiconductor substrate 20. The barrier layer 21 may be formed of, e.g., Ta or TaN. And the barrier layer 21 and the seed layer 22 may be formed by PVD.

Then, with reference to FIG. 10, the opening is filled with a conductive material 23, specifically copper. The copper covers the seed layer 22. After the filling, the surface of the copper is planarized by, e.g., chemical-mechanical polishing (CMP), such that the upper surface 20a of the semiconductor substrate 20 is exposed.

In other embodiments, the conductive material 23 may be tungsten or aluminium, and the filling may be performed by PVD or CVD; the conductive material 23 may also be doped polycrystalline silicon, the filling may be performed by CVD, and the dopants are introduced to the polycrystalline silicon by in-situ doping.

Figure 13:
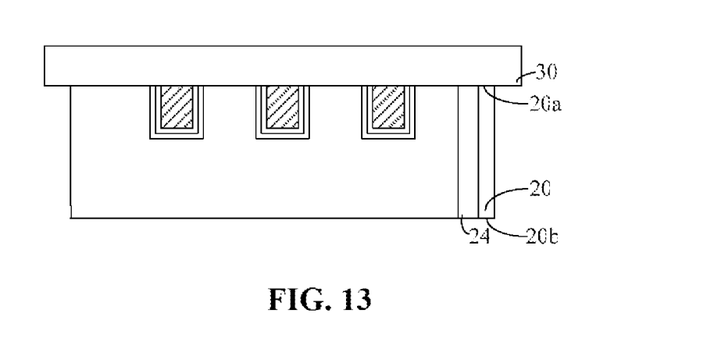
Figure 14:
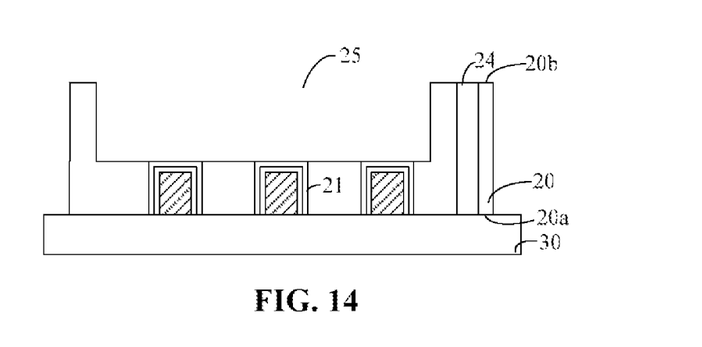

With reference to FIG. 6 and FIG. 14, step S24 is performed: etching the lower surface 20b of the semiconductor substrate 20 to form a recess 25, such that the first nail is exposed at a bottom of the recess 25. Now refer to FIG. 11 to FIG. 14.

Figure 11:
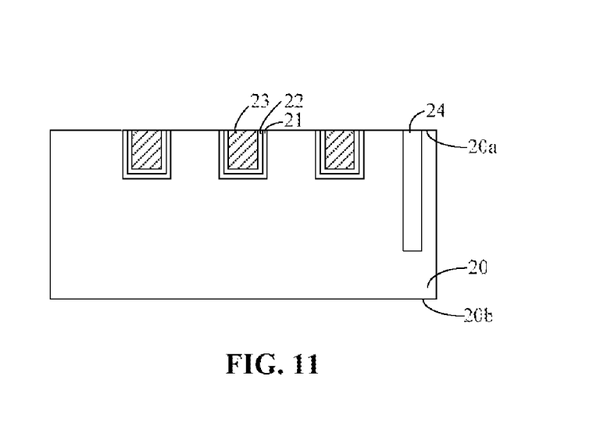

Firstly, with reference to FIG. 11, a lithography alignment mark 24 is formed on the upper surface 20a of the semiconductor substrate 20. The lithography alignment mark 24 has a depth larger than the depth of the first nail, i.e., larger than the depth of the opening. More specifically, the depth of the lithography alignment mark 24 is larger than or equal to the desired depth of the eventual nail in the TSV. The lithography alignment mark 24 may be a trench formed on the upper surface 20a, or may be a dielectric or a metal material filled in the trench.

Figure 12:
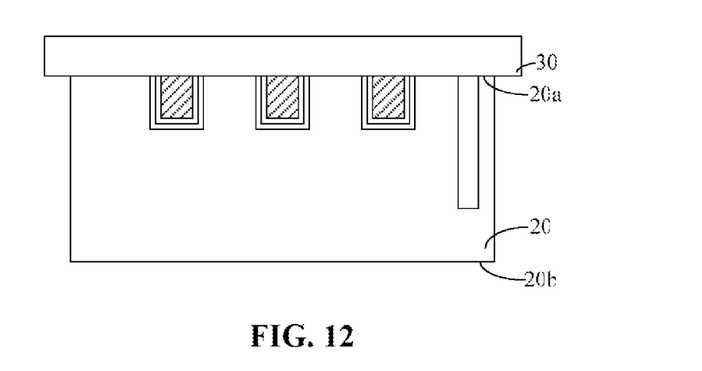

Then, with reference to FIG. 12, the upper surface 20a of the semiconductor substrate 20 is attached to a carrier substrate 30. The carrier substrate 30 may be, e.g., a silicon substrate or a glass substrate. And the attachment may be performed by, e.g., adhesive or bonding.

Then, with reference to FIG. 13, the lower surface 20b of the semiconductor substrate 20 is thinned, such that the remaining thickness of the semiconductor substrate 20 meets the practical requirement for its mechanical strength. After the thinning, the lithography alignment mark is exposed at the lower surface 20b of the semiconductor substrate 20.

Then, with reference to FIG. 14, the semiconductor substrate 20 and the carrier substrate 30 are flipped over, and the lower surface 20b of the semiconductor substrate 20 is etched to form a recess 25. The first nail is exposed at the bottom of the recess 25. Specifically in this embodiment, it is the barrier layer 21 that is exposed. The width of the recess 25 should be large enough to ensure good filling-in of the conductive material that can be etched. In this embodiment, the width of the recess 25 covers all the first nails that have been formed on the upper surface 20a. The recess 25 may be formed by, e.g., lithography and etching.

Figure 15:
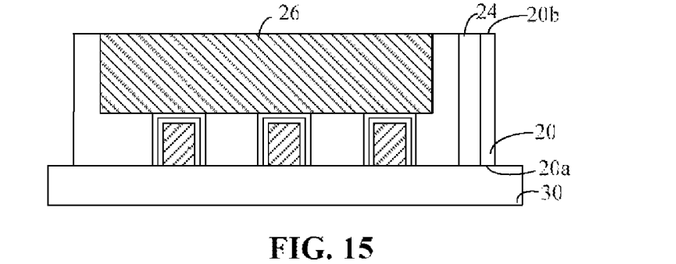
Figure 16:
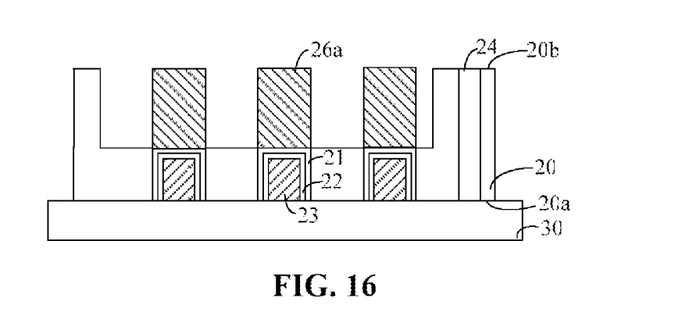

With reference to FIG. 6, FIG. 15 and FIG. 16, step S25 is performed: filling the recess with a conductive material that can be etched 26, and etching the conductive material that can be etched 26 to form a second nail 26a, such that the second nail 26a is vertically connected with the first nail. Specifically in this embodiment, the second nail 26 is connected with the barrier layer 21.

The conductive material that can be etched 26 may be any one of: aluminium, doped polycrystalline silicon, and doped polycrystalline silicon-germanium. Preferably in this embodiment, the conductive material that can be etched 26 is aluminium, and the filling is performed by PVD or CVD.

The conductive material that can be etched 26 may be patterned by lithography and etching, to form the second nail 26a. Each of the nails 26a is vertically connected with a first nail in a corresponding location. In patterning, the lithography alignment mark 24 may be used to have the second nail 26a formed through etching and the first nail formed at the upper surface 20 aligned.

It should be noted that, the conductive material that can be etched 26 should be etched through, i.e., the semiconductor substrate 20 is exposed at the bottom of the gap formed after etching, so as to ensure insulation between the second nails 26a.

Figure 17:
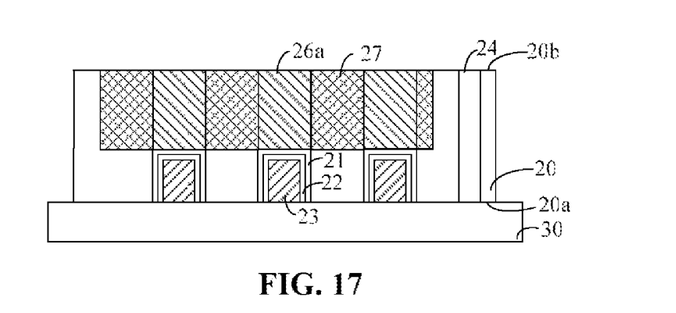

With reference to FIG. 6 and FIG. 17, step S26 is performed: filling a gap between the second nail 26a and the semiconductor substrate 20 and a gap between the second nail 26a and an adjacent second nail 26a with a dielectric layer 27. The dielectric layer may be formed of any one of: silicon oxide, silicon oxynitride and a low-k dielectric, and may be formed by CVD. In forming of the dielectric layer 27, the dielectric layer 27 may cover the surface of the second nail 26a; hence, the surface of the dielectric layer 27 may have to be planarized such that the second nail 26a is exposed. The planarization may be performed by chemical-mechanical polishing (CMP) or selective etching.

Thus, as shown in FIG. 17, the TSV formed according to the embodiment of the present invention includes: a semiconductor substrate 20, wherein the semiconductor substrate 20 includes a recess formed on it, and the recess is filled with a dielectric layer 27; and a nail passing through the semiconductor substrate 20 and the dielectric layer 27, wherein the nail includes a first nail (specifically in this embodiment, the first nail includes a barrier layer 21, a seed layer 22 and copper 23) and a second nail 26a connected vertically, the first nail is embedded in the semiconductor substrate 20, the second nail is embedded in the dielectric layer 27, and the second nail is formed of a conductive material that can be etched.

In this embodiment, the TSV includes a first nail formed at the upper surface and a second nail 26a formed at the lower surface. The aspect ratio of the opening is medium, resulting in better filling that forms the first nail, and avoiding voids in the first nail. Moreover, the second nail is formed by filling a conductive material that can be etched, and the recess has a relatively large width, resulting in better filling-in of the conductive material that can be etched, and avoiding voids in the second nail.

Figure 18:
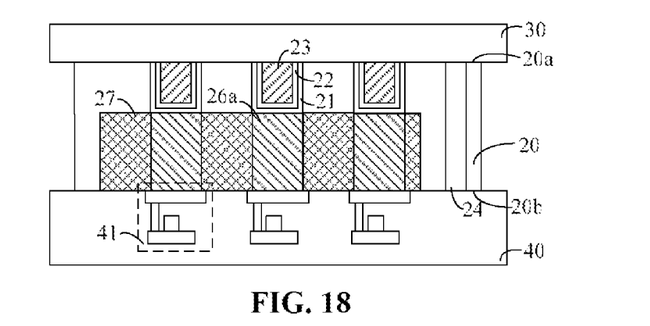

Afterwards, with reference to FIG. 18, the semiconductor substrate and a substrate 40 is connected through the nail. In an embodiment, a sensor is formed on the upper surface 20a of the semiconductor substrate, and a control circuit with a plurality of subunits 41 is formed on the substrate 40; after interconnection, each of the subunits of the sensor is connected with a corresponding subunit 41 of the control circuit.

Figure 19:
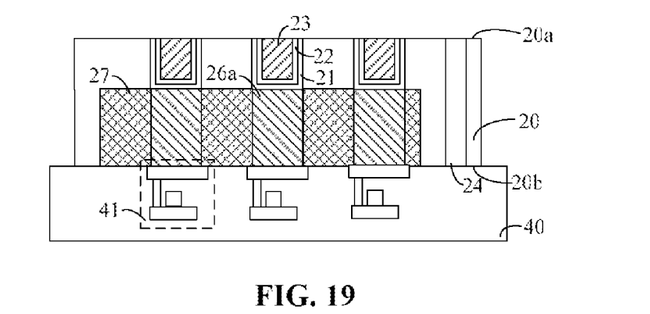

Then, with reference to FIG. 19, the carrier substrate is stripped off and the upper surface 20a of the semiconductor substrate 20 is exposed. After stripping, the upper surface 20a may be cleaned. And the semiconductor substrate 20 and the substrate 40 may be diced to obtain separate dies.

Preferred embodiments of the invention are disclosed herein, which should not be interpreted as limiting the scope of the invention. Alternations and modifications can be made to the technical solution of the invention by those skilled based on the technical disclosure herein without deviation from the scope of the invention. Therefore, any alternations, equivalents, and modifications made to the embodiments disclosed herein based on the technical essential of the invention without deviation from the scope of the invention, should fall within the scope of the invention.

The invention claimed is:

1. A method for forming a Through-Silicon Via (TSV), comprising:
   providing a semiconductor substrate, the semiconductor substrate comprising an upper surface and an opposite lower surface;
   etching the upper surface of the semiconductor substrate to form an opening;
   filling the opening with a conductive material to form a first nail;
   etching the lower surface of the semiconductor substrate to form a recess, such that the first nail is exposed at a bottom of the recess;
   filling the recess with a conductive material that can be etched, and etching the conductive material that can be etched to form a second nail, such that the second nail is vertically connected with the first nail; and
   filling a gap between the second nail and the semiconductor substrate and a gap between the second nail and an adjacent second nail with a dielectric layer.

2. The method for forming a TSV according to claim 1, wherein, the conductive material that can be etched is any one of: aluminium, doped polycrystalline silicon, and doped polycrystalline silicon-germanium.

3. The method for forming a TSV according to claim 1, wherein, the conductive material that can be etched is aluminium, and the filling the recess with a conductive material that can be etched is performed by physical vapor deposition (PVD) or chemical vapor deposition (CVD).

4. The method for forming a TSV according to claim 1, wherein, the dielectric layer is formed of any one of: silicon oxide, silicon oxynitride, and a low-k dielectric.

5. The method for forming a TSV according to claim 1, wherein, the method further comprises: after forming of the first nail and before forming of the recess,
   attaching the upper surface of the semiconductor substrate to a carrier substrate; and
   thinning the lower surface of the semiconductor substrate.

6. The method for forming a TSV according to claim 5, wherein, the method further comprises: before the attaching the upper surface of the semiconductor substrate to a carrier substrate,
   forming a lithography alignment mark on the upper surface of the semiconductor substrate, the lithography alignment mark having a depth larger than a depth of the first nail.

7. The method for forming a TSV according to claim 6, wherein, the thinning the lower surface of the semiconductor substrate is performed such that the lithography alignment mark is exposed.

8. The method for forming a TSV according to claim 5, wherein, the carrier substrate is a silicon substrate or a glass substrate.

9. The method for forming a TSV according to claim 1, wherein, the conductive material is copper, and the filling the opening with a conductive material to form a first nail comprises:
   forming a barrier layer and a seed layer over a bottom and a sidewall of the opening;
   filling the opening with copper, which covers the seed layer;
   planarizing a surface of the copper, such that the upper surface of the semiconductor substrate is exposed.

10. The method for forming a TSV according to claim 1, wherein, the conductive material is tungsten or aluminium, and the filling the opening with a conductive material is performed by physical vapor deposition (PVD) or chemical vapor deposition (CVD).

11. The method for forming a TSV according to claim 1, wherein, the conductive material is doped polycrystalline silicon, and the filling the opening with a conductive material is performed by CVD.

12. The method for forming a TSV according to claim 1, wherein, the method further comprises: after forming of the dielectric layer,
   planarizing a surface of the dielectric layer, such that the second nail is exposed.

* * * * *